US010831295B2

(12) United States Patent
Hoka et al.

(10) Patent No.: US 10,831,295 B2
(45) Date of Patent: Nov. 10, 2020

(54) TOUCH SCREEN, TOUCH PANEL, DISPLAY DEVICE, AND ELECTRONIC APPARATUS

(71) Applicant: Mitsubishi Electric Corporation, Tokyo (JP)

(72) Inventors: Naruhito Hoka, Tokyo (JP); Tatsuya Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/067,149

(22) PCT Filed: Feb. 16, 2017

(86) PCT No.: PCT/JP2017/005671
§ 371 (c)(1),
(2) Date: Jun. 29, 2018

(87) PCT Pub. No.: WO2017/150197
PCT Pub. Date: Sep. 8, 2017

(65) Prior Publication Data
US 2019/0004656 A1    Jan. 3, 2019

(30) Foreign Application Priority Data
Mar. 3, 2016  (JP) .................................. 2016-040835

(51) Int. Cl.
*G09G 5/00*   (2006.01)
*G06F 3/041*  (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC ......... G06F 3/0412; G06F 3/044–0448; G06F 3/047; G06F 2203/04107;
(Continued)

(56) References Cited

U.S. PATENT DOCUMENTS

| 5,844,506 A | 12/1998 | Binstead |
| 6,137,427 A | 10/2000 | Binstead |

(Continued)

FOREIGN PATENT DOCUMENTS

| JP | H09-511086 A | 11/1997 |
| JP | H10-284592 A | 10/1998 |

(Continued)

OTHER PUBLICATIONS

International Search Report issued in PCT/JP2017/005671; dated Mar. 21, 2017.

*Primary Examiner* — Jennifer T Nguyen
(74) *Attorney, Agent, or Firm* — Studebaker & Brackett PC (57) ABSTRACT

It is an object of the present invention to reduce an offset of an electrostatic capacitance and suppress a bias of detection sensitivity in a touch screen having a narrowed frame. A touch screen of the present invention includes a plurality of detection row wirings extending in a row direction, a plurality of detection column wirings, a plurality of lead wirings electrically connecting the plurality of detection row wirings and the plurality of detection column wirings to a terminal and being disposed to be drawn close to each other, and an outermost peripheral shielded wiring which surrounds the detection area along a further outer side of the outermost lead wirings and is connected to the terminal. There is a region which does not include an interlayer insulating film in a region between the detection area or the plurality of lead wirings and the outermost peripheral shielded wiring.

16 Claims, 9 Drawing Sheets

(51) Int. Cl.
*G06F 3/044* (2006.01)
*G02F 1/1333* (2006.01)
*G06F 3/047* (2006.01)
*H01L 23/532* (2006.01)

(52) U.S. Cl.
CPC ............ *G06F 3/047* (2013.01); *G06F 3/0416*
(2013.01); *H01L 23/5329* (2013.01); *G06F*
*2203/04107* (2013.01); *G06F 2203/04112*
(2013.01)

(58) Field of Classification Search
CPC ....... G06F 2203/04112; G02F 1/13338; H01L
23/5329
USPC .................................... 345/173, 204; 349/84
See application file for complete search history.

(56) References Cited

U.S. PATENT DOCUMENTS

| | | |
|---|---|---|
| 6,452,514 B1 | 9/2002 | Philipp |
| RE40,867 E | 8/2009 | Binstead |
| 2010/0060602 A1* | 3/2010 | Agari ...................... G06F 3/044 345/173 |
| 2011/0018560 A1* | 1/2011 | Kurashima ............. G06F 3/044 324/679 |
| 2013/0242485 A1 | 9/2013 | Ohtani et al. |

FOREIGN PATENT DOCUMENTS

| | | |
|---|---|---|
| JP | 2003-526831 A | 9/2003 |
| JP | 2012-103761 A | 5/2012 |
| JP | 5617811 B2 | 9/2014 |
| WO | 95/27334 A1 | 10/1995 |
| WO | 00/44018 A1 | 7/2000 |

\* cited by examiner

TOUCH SCREEN, TOUCH PANEL, DISPLAY DEVICE, AND ELECTRONIC APPARATUS

TECHNICAL FIELD

The present invention relates to a touch screen, a touch panel including the touch screen, a display device and an electronic apparatus including the touch panel.

BACKGROUND ART

A touch panel is widely known as an apparatus for detecting and outputting a position on a touch screen indicated by an indicator such as a finger of a user or a pen (also referred to as "a touch position" hereinafter). A plurality of detection systems are known as a system of detecting the touch position on the touch panel. As one type of a capacitive touch panel in the detection systems, projected capacitive ouch panels are known (for example, refer to Patent Documents 1 and 2).

The projected capacitive touch panels can detect the touch position even when a surface on a user side of the touch screen (referred to as "the front side surface" in some cases hereinafter) is covered with a protection plate such as a glass plate having a thickness of approximately several mm. The projected capacitive touch panels have advantages that they are superior in toughness by reason that the protection plate can be disposed on the front side surface, the touch position can be detected even when the user performs a touch operation with gloved fingers, and they have a long life by reason that they have no moving part, for example.

The touch screen of the projected capacitive touch panel includes a detection column wiring for detecting a coordinate of the touch position in a column direction and a detection row wiring for detecting a coordinate of the touch position in a row direction. In the description hereinafter, the detection column wiring and the detection row wiring are integrally referred to as "the detection wirings" in some cases.

Patent Document 2 discloses a touch pad system corresponding to the touch panel. The touch pad system disclosed in Patent Document 2 includes a first series of conductive elements formed on a thin dielectric film and a second series of conductive elements formed above the first series of conductive elements through an insulation film as the detection wirings for detecting an electrostatic capacitance (simply referred to as "the capacitance" in some cases hereinafter). There is no electrical contact between the conductive elements. Although the first series of conductive elements and the second series of conductive elements have an overlap with each other when seen from a normal direction of the front side surface, intersections having no electrical contact are formed.

A detection circuit detects a capacitance (referred to as "the touch capacitance" in some cases hereinafter) formed between an indicator, such as a finger, and the conductive elements, which are detection wirings, to determine position coordinates of the touch position of the indicator. The touch position between the conductive elements can be interpolated by a relative value of the detected capacitance of at least one conductive element. Such a method of detecting the position coordinates is generally called a self-capacitance system.

There is also a detection system that a change in an electric field between a plurality of detection row wirings extending in a row direction, which form first electrodes, and a plurality of detection column wirings extending in a column direction, which form second electrodes, that is to say, a change in a mutual capacitance is detected to determine the position coordinates of the touched position (for example, refer to Patent Document 3). Such a detection system is generally called a mutual-capacitance system.

In either of the above self-capacitance system and mutual-capacitance system, a method is generally employed in which when a planar region (detection cell) divided into a grid pattern by the detection row wirings and the detection column wirings is touched by an indicator such as a finger, the position coordinates of the touch position are determined based on a balance between a detection value of the touched detection cell (sensor block) and a detection value of a detection cell near the sensor block.

In the present specification, a member in which the detection column wirings and the detection row wirings are disposed on the substrate is referred to as "the touch screen" and, an apparatus in which the detection circuit is connected to the touch screen is referred to as "the touch panel". A region where the touch position can be detected is referred to as "a detectable area" in the touch screen.

Intersections between the detection column wirings and the detection row wirings constitute sensor capacitors. It is ideal that electrostatic capacitance values of the sensor capacitors are uniform in a surface of the touch screen in a state where no physical quantity acts on the touch screen. However, when a touch panel is used in combination with a display module, such as a liquid crystal display (LCD), a parasitic capacitance is formed between the display module and a lead wiring outside the detectable area, thus an offset occurs in an electrostatic capacitance of the sensor capacitors even in a state where no physical quantity acts on the touch screen. It is hard to distinguish between an offset of the electrostatic capacitance existing independently from the action of the physical quantity and the electrostatic capacitance caused by an action of a physical quantity in an output voltage of the projected capacitive touch screen, and this causes a detection error of a physical quantity.

Accordingly, Patent Document 4 proposes a method of reducing an offset of an electrostatic capacitance of a pair of sensor capacitors. Patent document 4 discloses a touch screen in which an outer periphery of a detectable area is surrounded by a plurality of lead wirings, a dummy lead wiring is provided along a lateral side of the outermost lead wiring (also referred to as "the outermost side lead wiring" hereinafter), and the dummy lead wiring is set to have predetermined potential, thereby promoting the reduction in the offset of the electrostatic capacitance.

PRIOR ART DOCUMENTS

Patent Documents

Patent Document 1: Japanese Patent Application Laid-Open No. 2012-103761
Patent Document 2: Translation of PCT application No. 9-511086
Patent Document 3: Translation of PCT Application No. 2003-526831
Patent Document 4: Japanese Patent No. 5617811

SUMMARY

Problem to be Solved by the Invention

In the touch screen of Patent Document 4, the offset of the electrostatic capacitance can be reduced when the potential of the dummy lead wiring approximates the potential of the detection wiring, however, a parasitic capacitance increases due to a coupling between the dummy lead wiring and the detection wiring with increase in the difference of the potential. Recently, the region for the lead wiring of the touch screen is reduced in accordance with downsizing of a frame of the display module, so that a distance from the lead wiring to the dummy lead wiring needs to be reduced. In the above case, the offset of the electrostatic capacitance of the detection wiring increases due to the dummy lead wiring.

Since the parasitic capacitance of the outermost lead wiring (also referred to as "the outermost side lead wiring" hereinafter) increases due to the coupling to the dummy lead wiring, it is different from that of the inner lead wiring. Thus, a detection accuracy of the touch screen is reduced, and some control IC may have a problem that an erroneous detection occurs.

Considered to solve such a problem is a method of increasing the parasitic capacitance of the inner lead wiring by adding a capacitance adjustment pattern to the lead wiring, thereby reducing the difference of the parasitic capacitance between the inner lead wiring and the outermost side lead wiring.

However, a large area of the lead wiring needs to be secured to add the capacitance adjustment pattern, so that it is hard to meet the recent downsizing of the frame. There is also a problem that a short circuit between the capacitance adjustment pattern and the lead wiring causes a reduction in yield.

The present invention therefore has been made to solve these problems, and it is an object of the present invention to reduce an offset of an electrostatic capacitance and suppress a bias of detection sensitivity in a touch screen having a narrowed frame.

Means to Solve the Problem

A touch screen of the present invention includes: a substrate; a plurality of detection row wirings extending in a row direction on the substrate; a plurality of detection column wirings extending in a column direction on the substrate and three-dimensionally intersecting with the plurality of detection row wirings to define a range of the intersection as a detection area; a terminal which can be electrically connected to an external device; a plurality of lead wirings electrically connecting the plurality of detection row wirings and the plurality of detection column wirings to the terminal and being disposed to be drawn close to each other; a shielded wiring which surrounds the detection area along a further outer side of an outermost lead wirings in the plurality of lead wirings and is connected to the terminal; and an interlayer insulating film insulating the plurality of detection row wirings, the plurality of detection column wirings, the plurality of lead wirings, and the shielded wiring from each other, wherein a region between the detection area or the plurality of lead wirings and the shielded wiring includes a region which does not have the interlayer insulating film.

Effects of the Invention

A touch screen of the present invention includes: a substrate; a plurality of detection row wirings extending in a row direction on the substrate; a plurality of detection column wirings extending in a column direction on the substrate and three-dimensionally intersecting with the plurality of detection row wirings to define a range of the intersection as a detection area; a terminal which can be electrically connected to an external device; a plurality of lead wirings electrically connecting the plurality of detection row wirings and the plurality of detection column wirings to the terminal and being disposed to be drawn close to each other; a shielded wiring which surrounds the detection area along a further outer side of an outermost lead wirings in the plurality of lead wirings and is connected to the terminal; and an interlayer insulating film insulating the plurality of detection row wirings, the plurality of detection column wirings, the plurality of lead wirings, and the shielded wiring from each other, wherein a region between the detection area or the plurality of lead wirings and the shielded wiring includes a region which does not have the interlayer insulating film. Accordingly, the parasitic capacitance between the outermost lead wiring and the shielded wiring is reduced, thus the offset of the self-capacitance of the outermost lead wiring can be reduced even in the touch screen having the narrowed frame, and the bias of detection sensitivity can be suppressed.

These and other objects, features, aspects and advantages of the present invention will become more apparent from the following detailed description of the present invention when taken in conjunction with the accompanying drawings.

DESCRIPTION OF EMBODIMENT(S)

Embodiment 1

Figure 1:
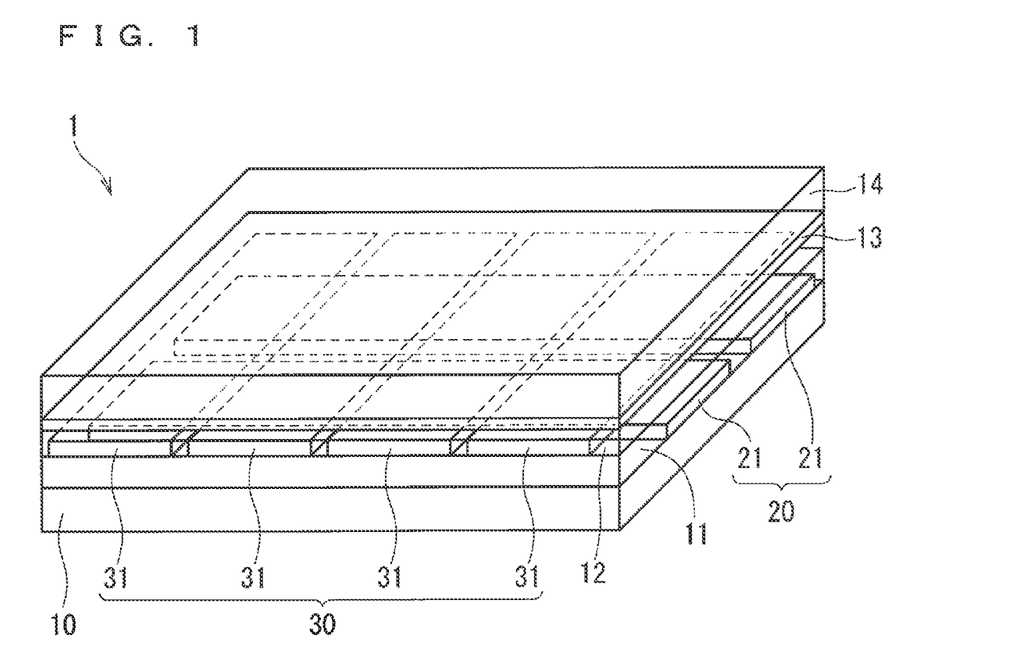
FIG. 1 A perspective view illustrating a layer structure of a touch screen.

A layer structure of a touch screen 1 according to the embodiment 1 is described using FIG. 1. FIG. 1 is a perspective view illustrating an example of a configuration of the touch screen 1. FIG. 1 shows a part of the touch screen 1 in a cut-out state where the touch screen 1 is cut in a normal direction of a front side surface thereof. The touch screen 1 is a projected capacitive touch screen.

As illustrated in FIG. 1, a transparent substrate 10 made up of a transparent glass material or a transparent resin is provided as a lowermost surface layer of the touch screen 1. A lower electrode 20 is provided on the transparent substrate 10. The lower electrode 20 is covered with an interlayer insulating film 11. The interlayer insulating film 11 is a transparent (translucent) insulating film such as a silicon nitride film or a silicon oxide film.

An upper electrode 30 is provided on the interlayer insulating film 11. The upper electrode 30 is covered with a protection film 12. The protection film 12 is a transparent insulating film such as a silicon nitride film or a silicon oxide film in the manner similar to the interlayer insulating film 11. That is to say, the upper electrode 30 and the interlayer insulating film 11 are insulated by the interlayer insulating film 11 and the protection film 12.

A polarization plate 13 for a liquid crystal display (LCD), on which the touch screen 1 is mounted, is provided on (attached to) the protection film 12. A transparent substrate 14 made up of a transparent glass material or a transparent resin is provided on (attached to) the polarization plate 13 to protect the touch screen 1.

Figure 2:
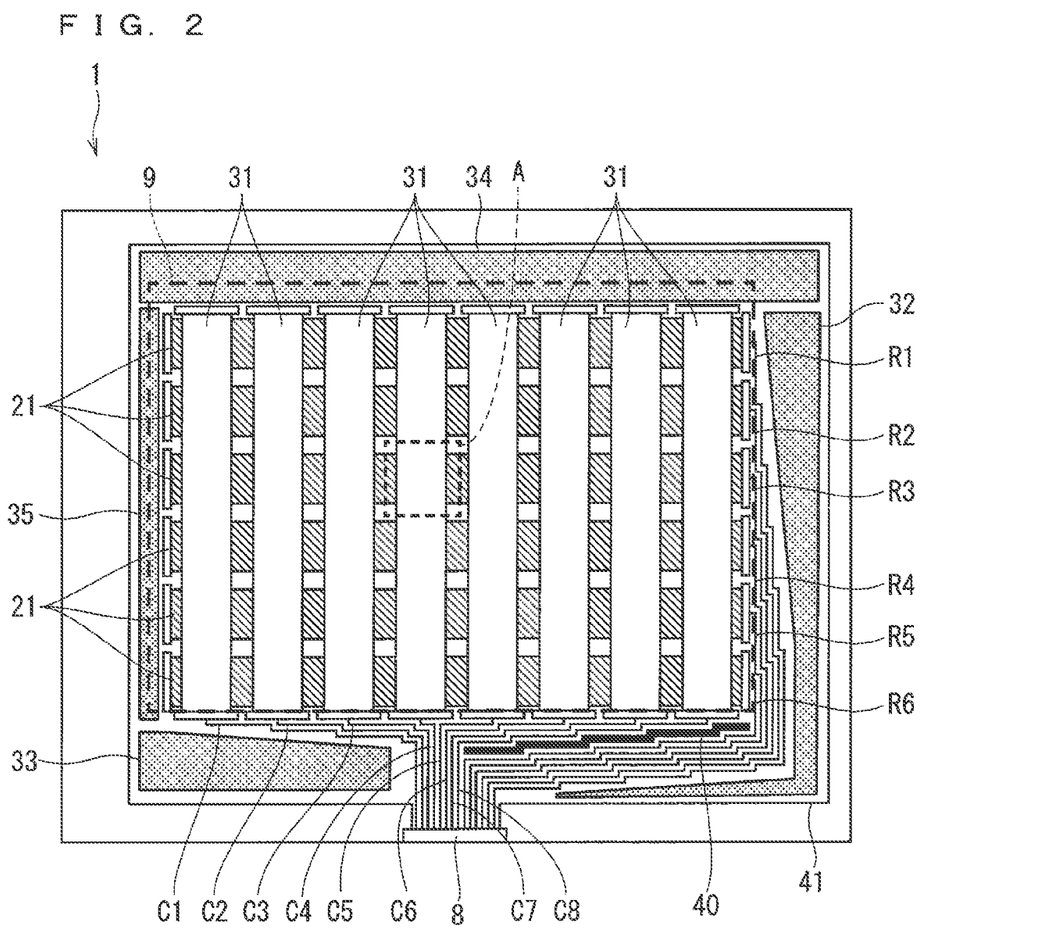
FIG. 2 A plan view of the touch screen viewed from a transparent substrate side.

The lower electrode 20 has a plurality of detection row wirings 21 extending in a row direction (a lateral direction of a paper sheet of FIG. 2). The detection row wirings 21 are made up of a transparent wiring material such as indium tin oxide (ITO) or a metal material such as aluminum, chromium, copper, or silver. The detection row wirings 21 may have a multi-layer structure of an aluminum-based alloy layer and a nitride layer thereof.

The upper electrode 30 has a plurality of detection column wirings 31 extending in a column direction (a longitudinal direction of a paper sheet of FIG. 2). The detection row wirings 21 and the detection column wirings 31 are insulated from each other by the interlayer insulating film 11 and three-dimensionally intersect with each other on the transparent substrate 10, and a range of these intersections is defined as a detection area of the touch screen 1. The detection column wirings 31 are also made up of a transparent wiring material such as indium tin oxide (ITO) or a metal material such as aluminum, chromium, copper, or silver in the manner similar to the detection row wirings 21. The detection column wirings 31 may have a multi-layer structure of an aluminum-based alloy layer and a nitride layer thereof. When each of the detection row wirings 21 and the detection column wirings 31 has a multi-layer structure of the aluminum-based alloy layer and the nitride layer thereof, wiring resistance can be reduced, and a reflectance of light can be reduced in a detectable area (a region where the touch position can be detected in the touch screen 1). However, the material of the detection column wirings 31 and the detection row wirings 21 is not limited thereto. For example, the detection column wirings 31 may have a multilayer structure of an aluminum-based alloy layer and a nitride layer thereof and the detection row wirings 21 may be made up of a transparent wiring material such as ITO.

Although FIG. 1 illustrates the configuration that the detection column wirings 31 are disposed on an upper layer of the detection row wirings 21, it is also applicable to reverse a positional relationship therebetween to locate the detection row wirings 21 on the upper layer of the detection column wirings 31. The detection column wirings 31 and the detection row wirings 21 may be disposed on the same layer and electrically separated from each other by providing the interlayer insulating film 11 only in positions where the detection column wirings 31 and the detection row wirings 21 three-dimensionally intersect with each other.

The present embodiment describes that an extending direction of the detection row wirings 21 is a row direction and an extending direction of the detection column wirings 31 is a column direction, and they are at right angles to each other, however, the extending directions and the intersection angle of those wirings are defined to simplify the description, and are not limited thereto. Each of the detection row wirings 21 and the detection column wirings 31 needs to extend in a direction different from each other in the layer where each of the wirings is provided.

A user touches the transparent substrate 14, which is a front side surface of the touch screen 1, with an indicator such as a finger for operation. When the indicator contacts (touches) the transparent substrate 14, a capacitive coupling occurs (touch capacitance is generated) between the indicator and the detection row wirings 21 and between the indicator and the detection column wirings 31. In the mutual-capacitance system, when the touch capacitance is generated, a change in the mutual capacitance between the upper electrode 30 and the lower electrode 20 caused by the generation of the touch capacitance is detected to determine which position in the detectable area is touched.

Described next using FIG. 2 are connections between the detection row wirings 21 and a terminal 8 and between the detection column wirings 31 and the terminal 8. FIG. 2 is a plan view of the touch screen 1 viewed from a side of the transparent substrate 14.

As described already, the plurality of detection row wirings 21 extend in the row direction (the lateral direction of the paper sheet of FIG. 2) and the plurality of detection column wirings 31 extend in the column direction (the longitudinal direction of the paper sheet of FIG. 2). A matrix area made up of these wirings extending in the two directions is the detectable area in the touch screen 1. Although FIG. 2 illustrates six detection row wirings 21 and eight detection column wirings 31, each total number of the wirings is not limited thereto.

The touch screen 1 includes the terminal 8 which can be electrically connected to an external device. First ends of the six detection row wirings 21 are connected to lead wirings R1 to R6, respectively, to be connected to the terminal 8 via the lead wirings R1 to R6. First ends of the eight detection column wirings 31 are also connected to lead wirings C1 to C8, respectively, to be connected to the terminal 8 via the lead wirings C1 to C8.

The lead wirings R1 to R6 and C1 to C8 are disposed close together on an outer peripheral side of the detectable area. With regard to the lead wirings R1 to R6, the lead wiring R6 connected to the detection row wiring 21, which is closest to the terminal 8, is the shortest in length and disposed on an innermost side. The lead wiring R1 connected to the detection row wiring 21, which is farthest from the terminal 8, is the longest in length and disposed on an outermost side. The other lead wirings R2 to R5 are disposed between the lead wiring R6 and the lead wiring R1 so that the lead wirings R5, R4, R3, and R2 are arranged in this order from an inner side toward an outer side. In this manner, the lead wirings R1 to R6 are disposed to be drawn close to each other.

With regard to the lead wirings C1 to C4, the lead wiring C4 connected to the detection column wiring 31, which is closest to the terminal 8, is the shortest in length and disposed on an innermost side. The lead wiring C1 connected to the detection column wiring 31, which is farthest from the terminal 8, is the longest in length and disposed on an outermost side. The other lead wirings C3 and C2 are disposed between the lead wiring C4 and the lead wiring C1 so as to be arranged in this order from an inner side toward an outer side.

With regard to the lead wirings C5 to C8, the lead wiring C5 connected to the detection column wiring 31, which is closest to the terminal 8, is the shortest in length and disposed on an innermost side. The lead wiring C8 connected to the detection column wiring 31, which is farthest from the terminal 8, is the longest in length and disposed on an outermost side. The other lead wirings C6 and C7 are disposed between the lead wiring C5 and the lead wiring C8 so as to be arranged in this order from an inner side toward an outer side. The lead wirings R1 to R6 connected to the detection row wirings 21 are drawn to be located an outer side of the lead wirings C8. Accordingly, the lead wirings C1 and R1 are the outermost lead wirings. In this manner, the lead wirings C1 to C8 are disposed to be drawn close to each other.

As described above, the lead wirings R1 to R6 and the lead wirings C1 to C8 are disposed close together on the outer peripheral side of the detectable area, thus fringe capacitance occurring between a display device, on which the touch screen 1 is mounted, and the lead wirings (the lead wirings R2 to R6 and the lead wirings C2 to C8) other than the outermost lead wirings can be suppressed.

A shielded wiring 40, to which reference potential such as ground potential is applied, is provided at a portion where the lead wiring C8 connected to one of the detection column wirings 31 and the lead wiring R6 connected to one of the detection row wirings 21 are arranged in parallel between the lead wirings C8 and R6. Since a crosstalk capacitance between the lead wiring C8 and the lead wiring R6 can be significantly reduced by providing the shielded wiring 40, an erroneous detection can be prevented even when the indicator such as the finger itches this portion.

Provided on the transparent substrate 10 is the outermost peripheral shielded wiring 41 which surrounds the detection area along a further outer side of the outermost lead wirings R1 and C1 and is connected to the terminal 8 to receive the ground potential. An electromagnetic noise intruded from outside can be absorbed by providing the outermost peripheral shielded wiring 41, thus a degradation of detection performance due to the electromagnetic noise can be prevented.

Although not shown in FIGS. 1 and 2 for simplification, the detection row wirings 21 and the detection column wirings 31 have a meshed structure that a plurality of conductive wirings are arranged in a meshed pattern. The meshed structure of the detection row wirings 21 and the detection column wirings 31 are described hereinafter using FIG. 3 to FIG. 7. In FIG. 3 to FIG. 7, the lateral direction of the paper sheet is defined as a row direction, and the longitudinal direction of the paper sheet is defined as a column direction. These drawings schematically illustrate the structure of the detection row wirings 21 and the detection column wirings 31, thus a thickness and an arrangement interval of the wirings are different from the actual ones.

Figure 3:
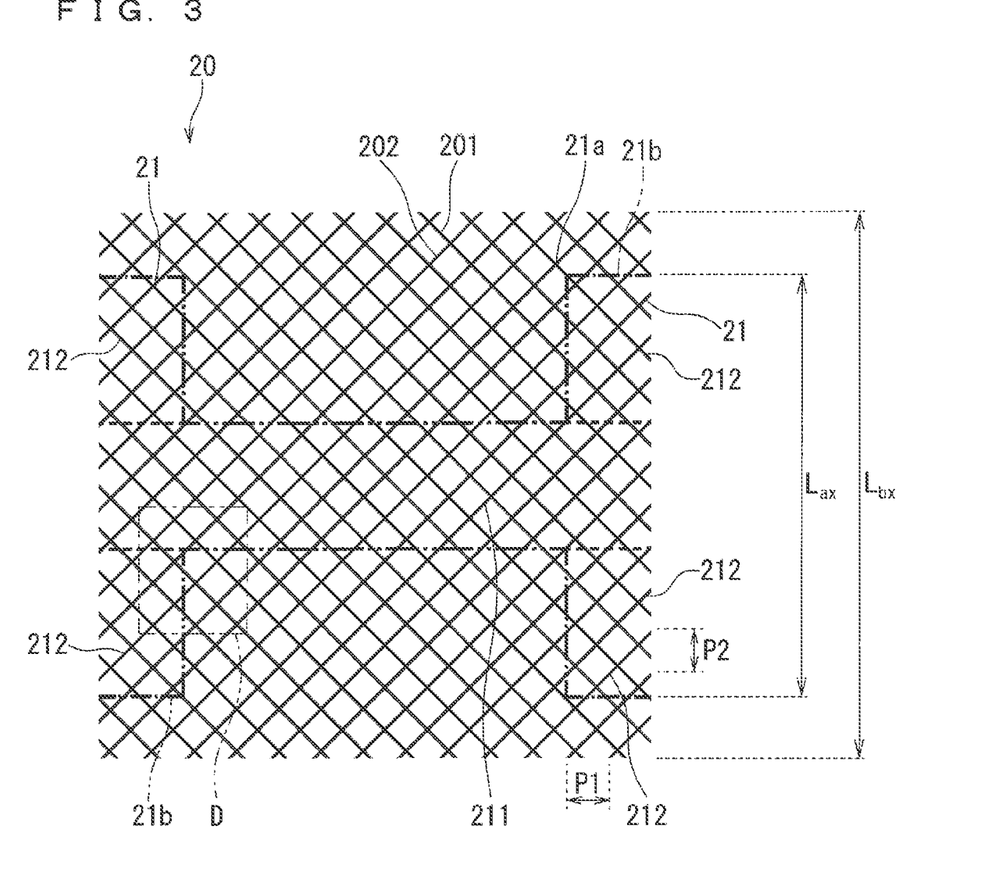
FIG. 3 An enlarged plan view illustrating a structure of a lower electrode in a region A in FIG. 2.

FIG. 3 is an enlarged plan view illustrating a structure of the lower electrode 20 in the region A in FIG. 2. The region A corresponds to one detection cell (unit cell) in the detectable area. As illustrated in FIG. 3, the lower electrode 20 has a meshed structure that a plurality of first row direction conductive wirings 201, which extend in a direction inclined at an angle of 45 degrees to the row direction, and a plurality of second row direction conductive wirings 202, which extend in a direction inclined at an angle of 45 degrees, being opposite to the direction of the first row direction conductive wirings 201, to the row direction intersect with each other. Repetition intervals of the mesh in the row direction and the column direction (also referred to as "the mesh interval" hereinafter) are the same in P1 and P2 (P1=P2).

The lower electrode 20 does not have a continuous meshed structure but has a non-continuous meshed structure that the mesh constituting the detection row wirings 21 and the mesh constituting a floating electrode 21a surrounding the detection row wirings 21 are separated from each other. The floating electrode 21a is electrically insulated from the detection row wirings 21 at a disconnection portion 21b provided along an outline of the detection row wirings 21, and is not grounded but in a potentially floating state.

Each of the detection row wirings 21 has a row direction center line 211 extending in the row direction and a plurality of detection row wiring expansion portions 212 provided at a predetermined interval with respect to an extending direction of the row direction center line 211 to partially expand a width of the row direction center line 211 in the column direction. A pair of the detection row wiring expansion portions 212 are provided at a position vertically symmetrical about the row direction center line 211. A width Lax of each of the detection row wirings 21 expanded by the detection row wiring expansion portions 212 is smaller than a size Lbx of the unit cell in the column direction. This means that a maximum width (Lax) of each of the detection row wirings 21 is smaller than an arrangement interval (Lbx) at which each of the detection row wirings 21 is disposed repeatedly in the detectable area. Such a setting can prevent interference between the adjacent detection row wirings 21.

Figure 4:
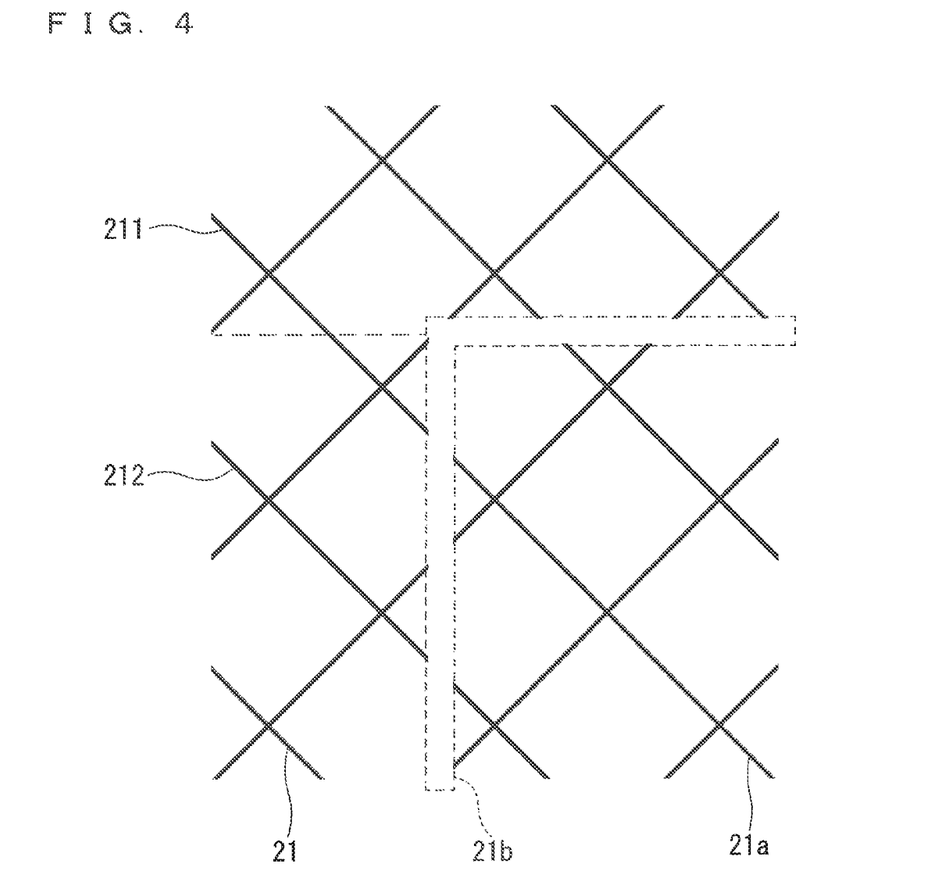
FIG. 4 An enlarged plan view of a region D in FIG. 3.

FIG. 4 is an enlarged plan view of a region D in FIG. 3. The region D is a region including a corner portion where the row direction center line 211 and each of the detection row wiring expansion portions 212 are connected to each other. The mesh constituting the detection row wirings 21 and the mesh constituting the floating electrode 21a are fractured at the disconnection portion 21b, and the disconnection portion 21b defines an outline of the detection row wirings 21. The floating electrode 21a surrounds the detection row wirings 21, thus the adjacent detection row wirings 21 are electrically insulated from each other. Accordingly, a coupling between the adjacent detection row wirings 21 is suppressed, thus a delay or a crosstalk of a detection signal in a case of connecting the touch screen 1 to a detection circuit can be reduced. Since the detection row wirings 21 are buried as a part of meshed pattern by providing the floating electrode 21a, a visual recognition of only the detection row wirings 21 is suppressed.

Figure 5:
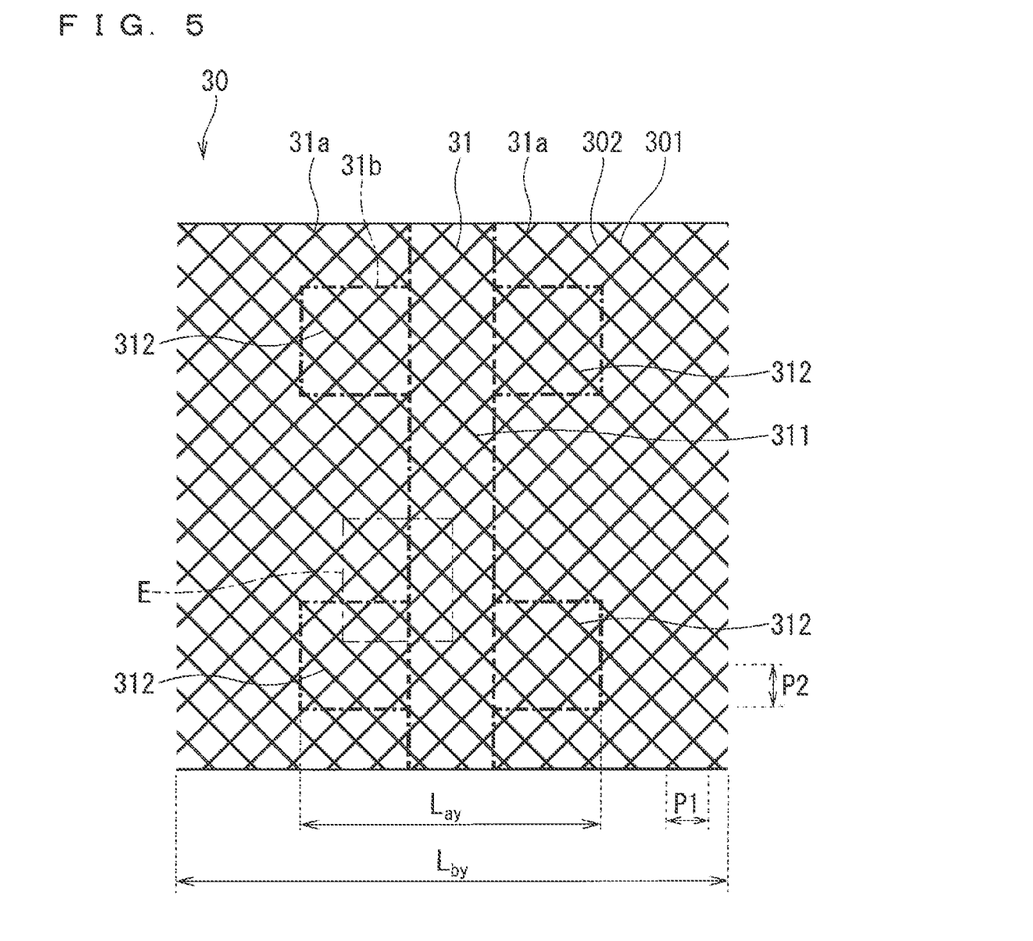
FIG. 5 An enlarged plan view illustrating a structure of an upper electrode in the region A in FIG. 2.

FIG. 5 is an enlarged plan view illustrating a structure of the upper electrode 30 in the region A in FIG. 2. As illustrated in FIG. 5, the upper electrode 30 has a meshed structure that a plurality of first column direction conductive wirings 301, which extend in a direction inclined at an angle of 45 degrees to the column direction, and a plurality of second row direction conductive wirings 302, which extend in a direction inclined at an angle of 45 degrees, being opposite to the direction of the first column direction conductive wirings 301, to the column direction intersect with each other. Mesh intervals in the row direction and the column direction are the same in P1 and P2 (P1=P2).

The upper electrode 30 does not have a continuous meshed structure but has a non-continuous meshed structure that the mesh constituting the detection column wirings 31 and the mesh constituting a floating electrode 31a surrounding the detection column wirings 31 are separated from each other. The floating electrode 31a is electrically isolated from the detection column wirings 31 at a disconnection portion 31b provided along an outline of the detection column wirings 31, and is not grounded but in a potentially floating state.

Each of the detection column wirings 31 has a column direction center line 311 extending in the column direction and a plurality of detection column wiring expansion portions 312 provided at a predetermined interval with respect to an extending direction of the column direction center line 311 to partially expand a width of the column direction center line 311 in the row direction. A pair of the detection column wiring expansion portions 312 are provided at a position laterally symmetrical about the column direction center line 311. A width Lay of the detection column wiring 31 expanded by the detection column expansion portions 312 is set to be smaller than a size Lby of a unit cell in the row direction. This means that a maximum width (Lay) of each of the detection column wirings 31 is smaller than an arrangement interval (Lby) at which each of the detection column wirings 31 is disposed repeatedly in the detectable area. Such a setting can prevent interference between the adjacent detection column wirings 31.

Figure 6:
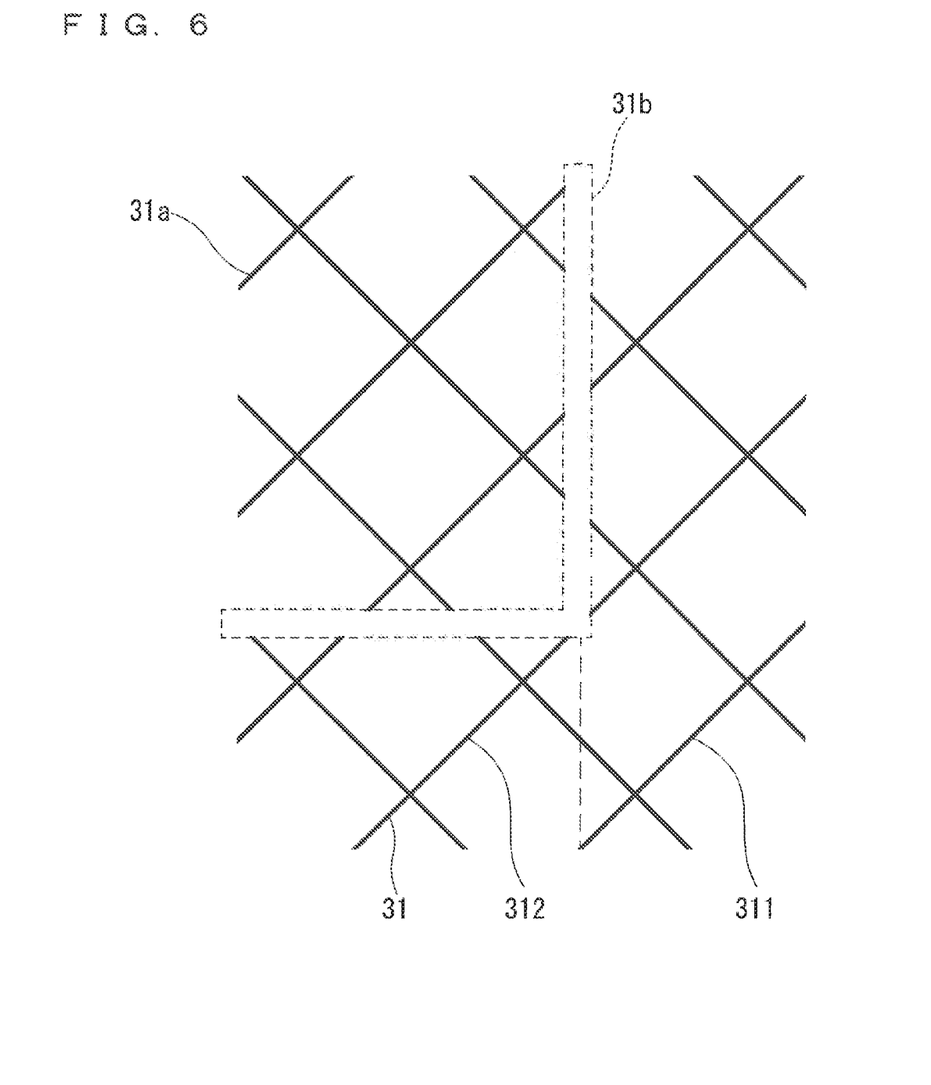
FIG. 6 An enlarged plan view of a region E in FIG. 5.

FIG. 6 is an enlarged plan view of a region E in FIG. 5. The region E is a region including a corner portion where the row direction center line 311 and each of the detection row wiring expansion portions 312 are connected to each other. The mesh constituting the detection column wirings 31 and the mesh constituting the floating electrode 31*a* are fractured at the disconnection portion 31*b*, and the disconnection portion 31*b* defines an outline of the detection column wirings 31. The floating electrode 31*a* surrounds the detection column wirings 31, thus the adjacent detection column wirings 31 are electrically insulated from each other. Accordingly, a coupling between the adjacent detection column wirings 31 is suppressed, thus a delay or a crosstalk of a detection signal in a case of connecting the touch screen 1 to a detection circuit can be reduced. Since the detection column wirings 31 are buried as a part of meshed pattern by providing the floating electrode 31*a*, a visual recognition of only the detection column wirings 31 is suppressed.

Figure 7:
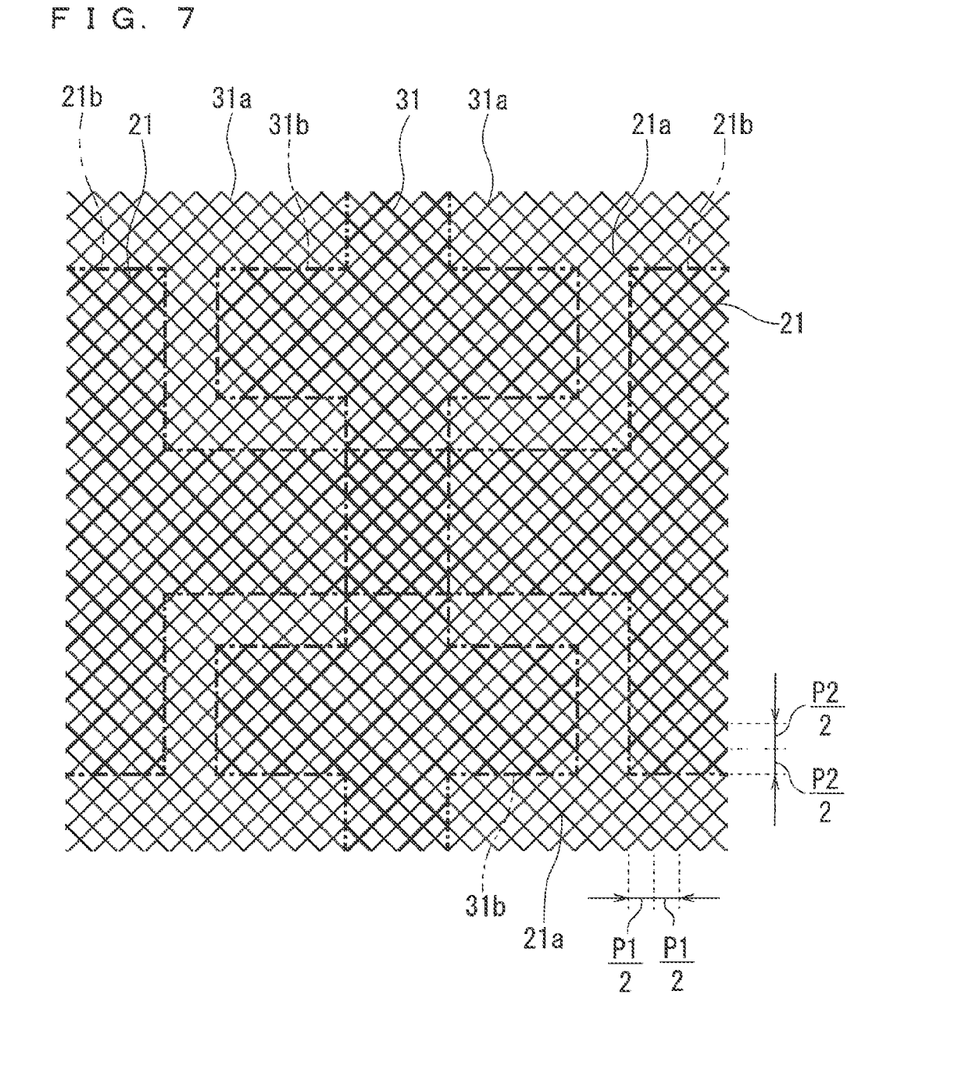
FIG. 7 An enlarged plan view illustrating a structure of the lower electrode and the upper electrode in the region A in FIG. 2.

FIG. 7 is an enlarged plan view illustrating a structure of the lower electrode 20 and the upper electrode 30 in the region A in FIG. 2, and illustrates an overlap between the lower electrode 20 and the upper electrode 30. As illustrated in FIG. 7, the lower electrode 20 and the upper electrode 30 has the overlap so that the meshed structures of the lower electrode 20 and the upper electrode 30 are deviated from each other in a complementary style in a plan view. Specifically, the mesh intervals of the lower electrode 20 is P1 in the row direction and P2 in the column direction as illustrated in FIG. 3, and the mesh of the lower electrode 20 is deviated by P1/2 in the row direction and P2/2 in the column direction to have the overlap with the upper electrode 30. Accordingly, in the region where the lower electrode 20 and the upper electrode 30 have the overlap with each other, it is visually recognized that the mesh intervals are P1/2 in the row direction and P2/2 in the column direction, being half of the mesh interval of the lower electrode 20 or the upper electrode 30 itself.

For example, in the region where the row direction center line 211 and the column direction center line 311 have the overlap with each other in a plan view, the meshes of the row direction center line 211 and the column direction center line 311 are deviated from each other in a complementary style, and the mesh interval halves. In the region where the row direction center line 211 and the floating electrode 31*a* have the overlap with each other in a plan view, the meshes of the row direction center line 211 and the floating electrode 31*a* are deviated from each other in a complementary style, and the mesh interval halves. In the region where the column direction center line 311 and the floating electrode 21*a* have the overlap with each other in a plan view, the meshes of the column direction center line 311 and the floating electrode 21*a* are deviated from each other in a complementary style, and the mesh interval halves.

In this manner, the upper electrode 30 and the lower electrode 20 have the overlap with each other so that the meshes of the upper electrode 30 and the lower electrode 20 are deviated from each other in the complementary style in the plan view, thus a reflectance of external light in a region where the detection row wirings 21 and the detection column wirings 31 intersect with each other can be uniformized, and the visual recognition of the detection row wirings 21 and the detection column wirings 31 can be suppressed.

Since the detection row wirings 21 and the detection column wirings 31 have the meshed structure, the wide detectable area can be covered with a small wiring area, the parasitic capacitance of the wiring can be reduced, and an occurrence of moire interference fringe can also be suppressed.

With regard to a size of each component of the touch screen 1 as an example, a width of the wiring constituting each mesh of the detection row wiring 21 and the detection column wiring 31 is 3 μm, and each disconnection interval by the disconnections portions 21*b* and 31*b* is 10 μm. A thickness of the transparent substrate 10 is 0.7 mm, and each of the interval P1 of the mesh in the row direction and the interval P2 of the mesh in the column direction is 200 μm. However, these sizes are adjusted depending on an intended use of the touch screen as needed.

In the present embodiment, the meshed structure of the wiring is made up of the linear conductive wiring, however, a meshed structure made up of a curved wiring having an arc shape, for example, is also applicable. There is no loss of the effect of the present embodiment even in this case.

Although not shown in the drawings, each of the lead wirings C1 to C8 and R1 to R6 and the outermost peripheral shielded wiring 41 is covered with an interlayer insulating film, thereby being insulated from each other. The interlayer insulating film is provided in the same layer as the interlayer insulating film 11 and the protection film 12 illustrated in FIG. 1.

The interlayer insulating film is not provided continuously from the detectable area and the lead wiring toward the outermost peripheral shielded wiring 41, and is not provided in regions 32 to 35 illustrated in FIG. 2.

The region 32 is a region located between the outermost peripheral lead wiring R1 and the outermost peripheral shielded wiring 41. The interlayer insulating film is removed (is not provided) in the region 32, thus a coupling between the lead wiring R1 and the outermost peripheral shielded wiring 41 and a coupling between the lead wiring R1 and the front frame 9 can be suppressed, and an offset of an electrostatic capacitance in the detectable area can be reduced.

The region 33 is a region located between the outermost peripheral lead wiring C1 and the outermost peripheral shielded wiring 41. The interlayer insulating film is removed (is not provided) in the region 33, thus a coupling between the lead wiring C1 and the outermost peripheral shielded wiring 41 and a coupling between the lead wiring C1 and the front frame 9 can be suppressed, and an offset of an electrostatic capacitance in the detectable area can be reduced.

The region 34 is a region located between ends of the detection column wirings 31 to which the lead wirings C1 to C8 are not connected and the outermost peripheral shielded wiring 41. The interlayer insulating film is removed (is not provided) in the region 34, thus a coupling between the detection column wirings 31 and the outermost peripheral shielded wiring 41 and a coupling between the detection column wirings 31 and the front frame 9 can be suppressed, and an offset of an electrostatic capacitance the detectable area can be reduced.

The region 35 is a region located between ends of the detection row wirings 21 to which the lead wirings R1 to R6 are not connected and the outermost peripheral shielded wiring 41. The interlayer insulating film is removed (is not provided) in the region 35, thus a coupling between the detection row wirings 21 and the outermost peripheral shielded wiring 41 and a coupling between the detection row wirings 21 and the front frame 9 can be suppressed, and an offset of an electrostatic capacitance in the detectable area can be reduced.

In the above description, all of the regions 32 to 35 do not include the interlayer insulating film, however, it is only necessary that the interlayer insulating film is not included at least in one of the regions 32 to 35 or in the plurality of optional regions in the regions 32 to 35. It may be determined in accordance of a size of the frame in which region the interlayer insulating film is removed.

Described next is the effect of reducing the offset of the self-capacitance of the wiring by removing the interlayer insulating film in the regions 32 to 35. In order to confirm the effect, prepared is a sample in which a touch screen including twenty-one detection row wirings R1 to R21 and thirty-four detection column wirings C1 to C34 is attached to a liquid crystal display including a grounded front frame having conductivity, and a capacitance of each wiring in the touch screen is calculated. A sample in which a touch screen which includes the interlayer insulating film in the regions 32 to 35 is used is prepared as a comparison example, and a capacitance is also calculated in the comparison example in the similar manner.

Figure 8:
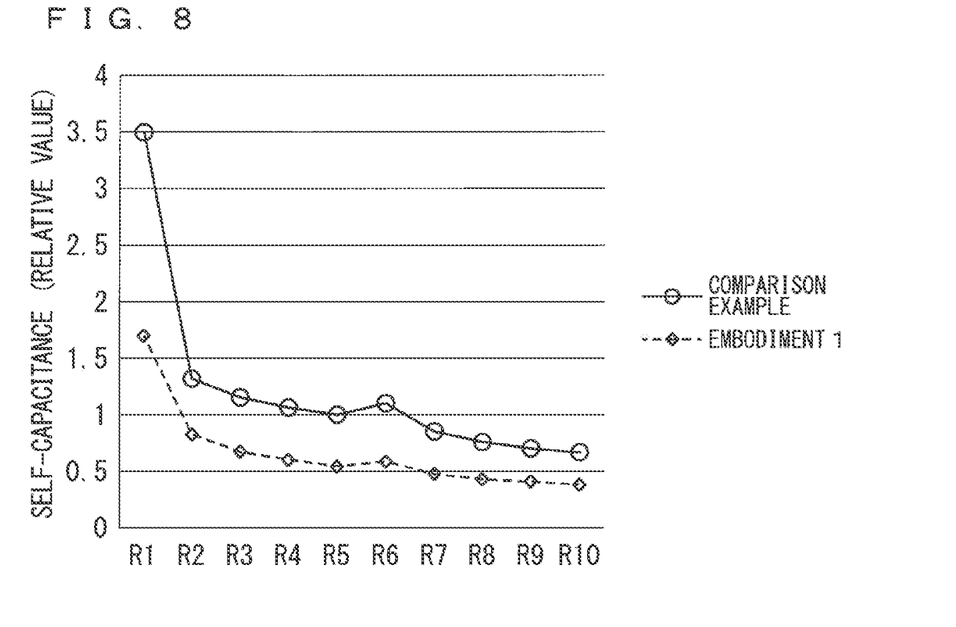
FIG. 8 A drawing illustrating self-capacitance relative values of detection row wirings in touch screens according to a comparison example and a present embodiment.

FIG. 8 illustrates a self-capacitance relative value of the lead wirings R1 to R10 connected to the detection row wirings in the touch screens according to the comparison example and the present embodiment. The self-capacitance relative value indicates a relative value in a case where the self-capacitance of the lead wiring R5 in the touch screen according to the comparison example is 1. As illustrated in FIG. 8, in the comparison example, the self-capacitance relative values of the lead wirings R2 to R10 take almost the same value, that is approximately 1, however, the self-capacitance relative value of the outermost lead wiring R1 is approximately 3.5, and is offset. In contrast, in the touch screen according to the present embodiment, it is confirmed that the self-capacitance relative values of all of the lead wirings including the outermost lead wiring R1 take almost the same value, that is approximately 1.

Figure 9:
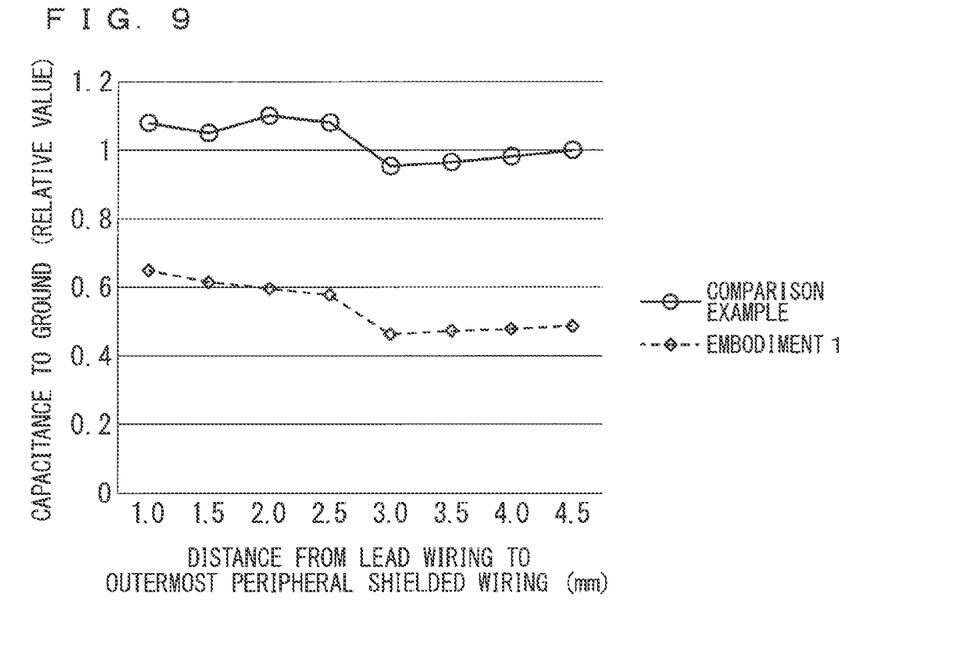
FIG. 9 A drawing illustrating capacitance to ground relative values at a time of changing a distance from an outermost peripheral lead wiring to an outermost peripheral shielded wiring in the touch screens according to the comparison example and the present embodiment.

FIG. 9 illustrates capacitance to ground relative values at a time of changing a distance from the outermost lead wiring to the outermost peripheral shielded wiring 41 in the touch screens according to the comparison example and the present embodiment. The capacitance to ground relative value indicates a relative value in a case where a capacitance to ground is 1 when the distance from the outermost lead wiring to the outermost peripheral shielded wiring 41 in the touch screen according to the comparison example is 4.5 mm.

According to the result, the lower capacitance to ground can be obtained in the touch screen according to the present embodiment in a case where the distance from the outermost lead wiring to the outermost peripheral shielded wiring 41 is 1.0 mm than a case where the distance from the outermost lead wiring to the outermost peripheral shielded wiring 41 in the touch screen according to the comparison example is 4.5 mm. That is to say, the above distance can be set to be equal to or smaller than 1.0 mm in the touch screen according to the present embodiment, thus the touch screen according to the present embodiment meets the downsizing of the frame.

That is to say, the touch screen 1 according to the embodiment 1 includes the transparent substrate 10 (substrate), the plurality of detection row wirings 21 extending in the row direction on the transparent substrate 10, the plurality of detection column wirings 31 extending in the column direction on the transparent substrate 10 and three-dimensionally intersecting with the plurality of detection row wirings 21 to define a range of the intersection as the detection area, the terminal 8 which can be electrically connected to the external device, the plurality of lead wirings R1 to R6 and C1 to C8 electrically connecting the plurality of detection row wirings 21 and the plurality of detection column wirings 31 to the terminal 8 and being disposed to be drawn close to each other, the outermost peripheral shielded wiring 41 (the shielded wiring) which surrounds the detection area along the further outer side of the outermost lead wirings R1 and C1 in the plurality of lead wirings R1 to R6 and C1 to C8 and is connected to the terminal 8, and the interlayer insulating film insulating the plurality of detection row wirings 21, the plurality of detection column wirings 31, the plurality of lead wirings R1 to R6 and C1 to C8, and the outermost peripheral shielded wiring 41 from each other. The touch screen 1 has a feature that there is the region which does not have the interlayer insulating film in the region between the detection area or the plurality of lead wirings and the shielded wiring. Accordingly, the parasitic capacitance between the outermost lead wiring and the shielded wiring and the parasitic capacitance between the outermost lead wiring and the front frame 9 are suppressed. The offset of the self-capacitance of the outermost lead wirings C1 and R1 can be thereby reduced even in the touch screen having the narrowed frame, and the bias of detection sensitivity can be suppressed.

The plurality of lead wirings R1 to R6 and C1 to C8 are connected to the first ends of the plurality of detection row wirings 21 and the first ends the plurality of detection column wirings 31. There is the region which does not include the interlayer insulating film at least in one of the region between the outermost lead wiring R1 in the plurality of lead wirings R1 to R6 connected to the plurality of detection row wirings 21 and the outermost peripheral shielded wiring 41 (the shielded wiring), the region between the outermost lead wiring C1 in the plurality of lead wirings C1 to C8 connected to the plurality of detection column wirings 31 and the outermost peripheral shielded wiring 41, the region between second ends of the plurality of detection row wirings 21 to which the lead wirings are not connected and the outermost peripheral shielded wiring 41, and the region between second ends of the plurality of detection column wirings 31 to which the lead wirings are not connected and the outermost peripheral shielded wiring 41. Accordingly, the parasitic capacitance between the outermost lead wirings C1 and R1 and the outermost peripheral shielded wiring 41 and the parasitic capacitance between the outermost lead wiring and the front frame 9 are suppressed. The offset of the self-capacitance of the outermost lead wirings C1 and R1 can be thereby reduced even in the touch screen having the narrowed frame, and the bias of detection sensitivity can be suppressed.

Embodiment 2

Figure 10:
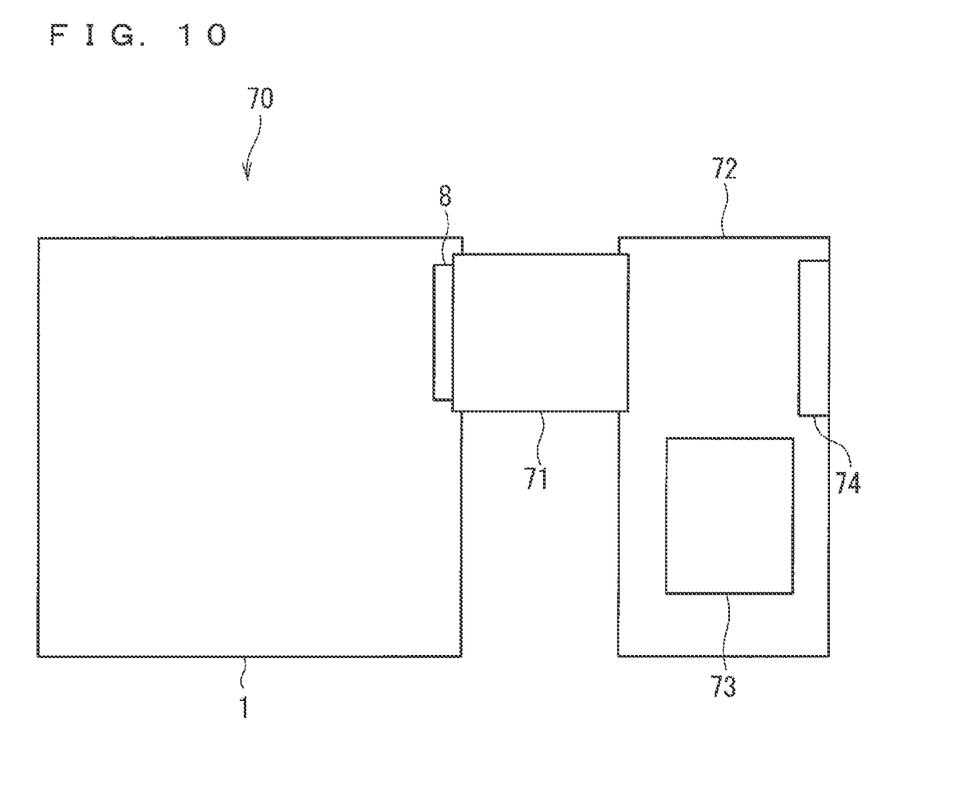
FIG. 10 A drawing schematically illustrating a whole configuration of a touch panel of an embodiment 2.

FIG. 10 is a drawing schematically illustrating a whole configuration of a touch panel 70 of an embodiment 2. The touch panel 70 includes the touch screen 1 of the embodiment 1 illustrated in FIG. 1, a flexible printed substrate 71, and a controller substrate 72. The flexible printed circuit (FPC) 71 having a terminal (a terminal corresponding to the terminal 8) mounted by using an anisotropic conductive film (ACF) is connected to the terminal 8 of the touch screen 1. The ends of the detection row wirings 21 and detection column wirings 31 in the touch screen 1 and the controller substrate 72 are electrically connected to each other via the flexible printed circuit 71, thus the touch screen 1 functions as a major constituent element of the touch panel 70.

A detection processing circuit 73 (a touch position detection circuit) is mounted on the controller substrate 72. The detection processing circuit 73 detects the electrostatic capacitance occurring between the indicator and one of the detection row wirings 21 and the detection column wirings 31 as the touch capacitance by applying the signal voltage, and performs a calculation processing of the touch position of the indicator on the touch screen 1 based on the detection result. That is to say, the detection processing circuit 73 detects the position on the touch screen 1 indicated by the indicator based on the electrostatic capacitance between the indicator which performs the indication on the touch screen 1 and the detection row wirings 21 and between the indicator and the detection column wirings 31.

A projected capacitive detection logic can be adopted to the detection processing circuit 73. The controller substrate 72 has an external connection terminal 74 for outputting the touch position calculated by the detection processing circuit 73 to an external processing apparatus.

The detection processing circuit 73 may be mounted on the transparent substrate 10 of the touch screen 1 as well as on the controller substrate 72.

That is to say, the touch panel of the embodiment 2 includes the touch screen 1 of the embodiment 1 (FIG. 1) and the touch position detection circuit which detects the position on the touch screen 1 indicated by the indicator based on the electrostatic capacitance between the indicator which performs the indication on the touch screen 1 and the detection row wirings 21 and detection column wirings 31. The coupling occurring between the outermost lead wirings R1 and C1 of the touch screen 1 and the display module such as the LCD is thereby reduced, thus the touch panel 70 in which the offset of the electrostatic capacitance of the sensor capacitor caused by the coupling is suppressed and the bias of the electrostatic capacitance detection sensitivity is reduced can be obtained.

Embodiment 3

A display device according to the embodiment 3 of the present invention includes the touch panel 70 according to the embodiment 2 illustrated in FIG. 10 and the display module such as the LCD capable of displaying information.

The touch panel 70 is disposed closer to a user in relation to a display screen of the display module. In other words, the display module is disposed on an opposite side of the transparent substrate 14 which is a front side surface of the touch panel 70. The display device provided with a touch panel having a function of detecting the touch position indicated by the user is achieved by such a configuration.

That is to say, the display device according to the embodiment 3 includes the touch panel 70 according to the embodiment 2 and the display module disposed on the opposite side of the touch screen 1 of the touch panel 70 on which the indication is performed, thus the display device provided with the touch panel in which the bias of the electrostatic capacitance detection sensitivity is reduced can be obtained.

Embodiment 4

An electronic apparatus according to the embodiment 4 of the present invention has a feature that it includes the touch panel 70 of the embodiment 2 (FIG. 10), the display module such as the LCD, and a signal processing apparatus (an electronic processing unit) which is an electronic device not shown in the drawings.

The signal processing apparatus inputs a signal being output from the external connection terminal 74 of the touch panel 70 and outputs the signal as a digital signal. That is to say, the signal processing apparatus electrically performs processing being predetermined for the information of the touch position detected by the detection processing circuit 73 of the touch panel 70. In this manner, the electronic apparatus having the function of detecting the touch position such as a digitizer, which outputs the information of the touch position detected by the detection processing circuit 73 of the touch panel 70 to an external signal processing apparatus such as a computer, can be achieved by the configuration of connecting the signal processing apparatus to the touch panel 70.

The signal processing apparatus may be built into (mounted on) the controller substrate 72 of the touch panel 70. In this case, the signal processing apparatus has the output function meeting a bus standard such as a universal serial bus (USB), thus the versatile electronic apparatus provided with the function of detecting the touch position can be achieved.

That is to say, the electronic apparatus according to the embodiment 4 includes the touch panel 70 according to the embodiment 2 and the signal processing apparatus (the electronic processing unit) which electrically performs the processing being predetermined for the information of the touch position detected by the detection processing circuit 73 (the touch position detection circuit) of the touch panel 70. Accordingly, the projected capacitive electronic apparatus with the function of detecting the touch position, in which the bias of the electrostatic capacitance detection sensitivity is reduced, can be obtained.

According to the present invention, the above embodiments can be arbitrarily combined, or each embodiment can be appropriately varied or omitted within the scope of the invention.

The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 touch screen, 8 terminal, 9 front frame, 10 transparent substrate, 11 interlayer insulating film, 12 protection film, 13 polarization plate, 14 transparent substrate, 20 lower substrate, 21 detection row wiring, 21A floating electrode, 21B disconnection portion, 30 upper electrode, 31 detection column wiring, 40 shielded wiring, 211 row direction center line, 212 detection row wiring expansion portion, C1 to C8 and R1 to R6 lead wiring.

The invention claimed is:

1. A touch screen, comprising:
a substrate;
a plurality of detection row wirings extending in a row direction on the substrate, every part of a respective row wiring is extending in a longitudinal direction of the respective row wiring;
a plurality of detection column wirings extending in a column direction on the substrate, every part of a respective column wiring is extending in a longitudinal direction of the respective column wiring, which is substantially perpendicular to the longitudinal direction of the respective row wiring, and the respective column wiring includes an intersection portion that is three-dimensionally overlapping with an intersection portion of the respective detection row wiring of the plurality of detection row wirings in a plan view, a range of the intersection portions of the plurality of detection row wirings and the plurality of detection column wirings defines a detection area;
a terminal configured to be electrically connected to an external device;
a plurality of lead wirings electrically connecting the plurality of detection row wirings and the plurality of detection column wirings to the terminal and being disposed to be drawn close to each other;
a shielded wiring which surrounds the detection area along a further outer side of an outermost lead wirings in the plurality of lead wirings and is connected to the terminal; and
an interlayer insulating film insulating the plurality of detection row wirings, the plurality of detection column wirings, the plurality of lead wirings, and the shielded wiring, from each other, wherein
a region between the detection area and the shielded wiring, or a region between the outermost lead wiring and the shielded wiring includes a region which does not have the interlayer insulating film, the region which does not have the interlayer insulating film includes a region where the lead wiring is not formed.

2. The touch screen according to claim 1, wherein
the plurality of lead wirings are connected to first ends of the plurality of detection row wirings and first ends of the plurality of detection column wirings, and
the region which does not have the interlayer insulating film is included at least in one of
a region between an outermost lead wiring in the plurality of lead wirings being connected to the plurality of detection row wirings and the shielded wiring,
a region between an outermost lead wiring in the plurality of lead wirings being connected to the plurality of detection column wirings and the shielded wiring,
a region between second ends of the plurality of detection row wirings to which the lead wirings are not connected and the shielded wiring, and
a region between second ends of the plurality of detection column wirings to which the lead wirings are not connected and the shielded wiring.

3. The touch screen according to claim 2, wherein
each of the detection row wirings and each of the detection column wirings are arranged in a meshed pattern.

4. A touch panel, comprising:
the touch screen according to claim 3; and
a touch position detection circuit which detects a position on the touch screen indicated by an indicator, which performs indication on the touch screen, based on an electrostatic capacitance between the indicator and the detection row wirings and detection column wirings.

5. A display device, comprising:
the touch panel according to claim 4; and
a display module being disposed on an opposite side of the touch screen of the touch panel on which the indication is performed.

6. An electronic apparatus, comprising:
the touch panel according to claim 4; and
an electronic processing unit electrically performing processing being predetermined for information of the position detected by the touch position detection circuit of the touch panel.

7. A touch panel, comprising:
the touch screen according to claim 2; and
a touch position detection circuit which detects a position on the touch screen indicated by an indicator, which performs indication on the touch screen, based on an electrostatic capacitance between the indicator and the detection row wirings and detection column wirings.

8. A display device, comprising:
the touch panel according to claim 7; and
a display module being disposed on an opposite side of the touch screen of the touch panel on which the indication is performed.

9. An electronic apparatus, comprising:
the touch panel according to claim 7; and
an electronic processing unit electrically performing processing being predetermined for information of the position detected by the touch position detection circuit of the touch panel.

10. The touch screen according to claim 1, wherein
each of the detection row wirings and each of the detection column wirings are arranged in a meshed pattern.

11. A touch panel, comprising:
the touch screen according to claim 10; and
a touch position detection circuit which detects a position on the touch screen indicated by an indicator, which performs indication on the touch screen, based on an electrostatic capacitance between the indicator and the detection row wirings and detection column wirings.

12. A display device, comprising:
the touch panel according to claim 11; and
a display module being disposed on an opposite side of the touch screen of the touch panel on which the indication is performed.

13. An electronic apparatus, comprising:
the touch panel according to claim 11; and
an electronic processing unit electrically performing processing being predetermined for information of the position detected by the touch position detection circuit of the touch panel.

14. A touch panel, comprising:
the touch screen according to claim 1; and
a touch position detection circuit which detects a position on the touch screen indicated by an indicator, which performs indication on the touch screen, based on an electrostatic capacitance between the indicator and the detection row wirings and detection column wirings.

15. A display device, comprising:
the touch panel according to claim 14; and
a display module being disposed on an opposite side of the touch screen of the touch panel on which the indication is performed.

16. An electronic apparatus, comprising:
the touch panel according to claim 14; and
an electronic processing unit electrically performing processing being predetermined for information of the position detected by the touch position detection circuit of the touch panel.

* * * * *